United States Patent
Itakura et al.

(10) Patent No.: US 7,009,448 B2
(45) Date of Patent: Mar. 7, 2006

(54) OPERATIONAL AMPLIFIER CIRCUIT, SAMPLE/HOLD CIRCUIT AND FILTER CIRCUIT USING THE OPERATIONAL AMPLIFIER CIRCUIT

(75) Inventors: Tetsuro Itakura, Tokyo (JP); Takafumi Yamaji, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/216,100

(22) Filed: Sep. 1, 2005

(65) Prior Publication Data

US 2005/0285673 A1 Dec. 29, 2005

Related U.S. Application Data

(62) Division of application No. 10/811,908, filed on Mar. 30, 2004.

(30) Foreign Application Priority Data

Mar. 31, 2003 (JP) .............................. 2003-093575

(51) Int. Cl.
 *H03F 3/45* (2006.01)
(52) U.S. Cl. ......................... 330/69; 330/258
(58) Field of Classification Search .................... None
 See application file for complete search history.

(56) References Cited

U.S. PATENT DOCUMENTS

| 5,963,088 | A | 10/1999 | Czarnul et al. |
| 5,990,737 | A | 11/1999 | Czarnul et al. |
| 6,191,655 | B1 * | 2/2001 | Moughabghab ............. 330/258 |
| 6,329,849 | B1 | 12/2001 | Czarnul et al. |
| 6,680,627 | B1 | 1/2004 | Hughes |
| 6,781,464 | B1 | 8/2004 | Ueno et al. |

FOREIGN PATENT DOCUMENTS

JP 2000-148262 5/2000

* cited by examiner

*Primary Examiner*—Khanh V. Nguyen
(74) *Attorney, Agent, or Firm*—Finnegan, Henderson, Farabow, Garrett & Dunner, L.L.P.

(57) ABSTRACT

An operational amplifier circuit is constituted by first and second inverted amplifier circuits (A1, A2) that receive first and second input signals, a third inverted amplifier circuit (A3) that receives an estimated common-mode output signal and an output signal from the first inverted amplifier circuit and outputs first and second output signals, a fourth inverted amplifier circuit (A4) that receives the estimated common-mode output signal and an output signal from the second inverted amplifier circuit and outputs third and fourth output signals, where the estimated common-mode output signal is generated by adding the second output signal and the fourth output signal, and first and second non-inverted amplifier circuits (A5, A6) that receive the estimated common-mode output signal and feed it back to the first and second inverted amplifier circuits.

3 Claims, 9 Drawing Sheets

(a) common-mode  (b) differential-mode

OPERATIONAL AMPLIFIER CIRCUIT, SAMPLE/HOLD CIRCUIT AND FILTER CIRCUIT USING THE OPERATIONAL AMPLIFIER CIRCUIT

CROSS-REFERENCE TO RELATED APPLICATIONS

This is a divisional of application Ser. No. 10/811,908, filed on Mar. 30, 2004, which claims the benefit of priority to Japanese Patent Application No. 2003-093575, filed on Mar. 31, 2003, all of which are incorporated herein by reference in their entireties.

BACKGROUND OF THE INVENTION

1. Field of the Invention

This invention relates to an operational amplifier circuit having a low power-supply voltage for handling differential signals, and more specifically to an operational amplifier circuit capable of improving frequency characteristics and decreasing a common-mode signal, and a sample/hold circuit and a filter circuit using the operational amplifier circuit.

2. Description of the Related Art

The progress of integrated circuits is remarkable and the fine fabrication process of integrated circuits progresses year by year. Although the finer fabrication process improves the performance of transistors per se, a breakdown voltage of a transistor is getting lower. Thus, the applicable power-supply voltage is getting lower. When the power-supply voltage is low, the amplitude of voltage signals in integrated circuits decreases, which makes it difficult to achieve a desired signal-to-noise ratio (S/N ratio). In order to solve this problem, a single-ended signal, which has been used, is changed to a differential signal to thereby double the signal amplitude as compared with the single-ended signal amplitude.

In a balanced operational amplifier circuit, which handles differential input/differential output, however, it is necessary to suppress a common-mode signal. If the elimination of the common-mode signal of the operational amplifier circuit is insufficient, the voltage range of the output decreases, which causes a distorted differential signal. Especially at a low power-supply voltage, since the available voltage range is limited, the suppression of a common-mode signal is essential.

Conventionally, in order to eliminate a common-mode signal, a common-mode feedback circuit was used (see, e.g., Japanese Patent Disclosure KOKAI P2000-148262). The design of this common-mode feedback circuit is complicated as compared with a differential-input circuit of a single-ended output, and defects such as oscillation tend to occur.

A balanced-type amplifier circuit was proposed in which amplifier circuits having a plurality of input terminals and output terminals are combined to decrease common-mode signal components (see, e.g., U.S. application Ser. No. 10/281,103 filed on Oct. 28, 2002).

Since the aforementioned conventional amplifier circuit can be realized by a simple structure in which inverted amplifier circuits are combined, a low power-supply voltage can be realized. However, in cases where such an amplifier circuit is constituted by two high gain stages in order to obtain enough gain, since the polarity must be reversed, it is necessary to use low gain stages whose gain is approximately 1. Accordingly, the number of internal nodes from the input to the output becomes 2 (two). As the number of internal nodes increases, the frequency characteristic deteriorates due to the parasitic capacitance in each node.

It is an object of the present invention to provide an operational amplifier circuit of a balanced structure using two gain stages appropriate for a low power-supply voltage, and in particular an operational amplifier circuit with sufficient common-mode rejection ratio and with a frequency characteristic improved by limiting the number of internal nodes in the differential signal path to 1(one), and a sample/hold circuit and a filter circuit using the operational amplifier circuit.

BRIEF SUMMARY OF THE INVENTION

According to an aspect of the invention, an operational amplifier circuit is provided, the circuit comprising: a first inverted amplifier circuit that receives a first input signal; a second inverted amplifier circuit that receives a second input signal; a third inverted amplifier circuit that receives an estimated common-mode output signal and an output signal of said first inverted amplifier circuit and outputs a first output signal and a second output signal; a fourth inverted amplifier circuit that receives the estimated common-mode output signal and an output signal of said second inverted amplifier circuit and outputs a third output signal and a fourth output signal; a first non-inverted amplifier circuit that receives the estimated common-mode output signal and outputs an output signal, the output signal of the first non-inverted amplifier circuit fed back to the output signal of the first inverted amplifier circuit; and a second non-inverted amplifier circuit that receives the estimated common-mode output signal and outputs an output signal, the output signal of the second non-inverted amplifier circuit fed back to the output signal of the second inverted amplifier circuit, wherein adding the second output signal and the fourth output signal creates the estimated common-mode output signal.

With an operational amplifier circuit of the present invention, in addition to the suppression of a common-mode signal by the third and fourth inverted amplifier circuits, the common-mode signal can be further suppressed by feeding the estimated common-mode output signals back to outputs of the first and second inverted amplifier circuits via first and second non-inverted amplifier circuits. Furthermore, since the number of internal nodes in the differential signal path can be reduced to one, the frequency characteristic of the operational amplifier circuit can also be improved.

DETAILED DESCRIPTION OF THE INVENTION

Hereinafter, embodiments according to the present invention will be explained with reference to the attached drawings. Although the following explanation will be directed to embodiments using field-effect transistors, bipolar transistors also can be utilized.

First Embodiment

Figure 1:
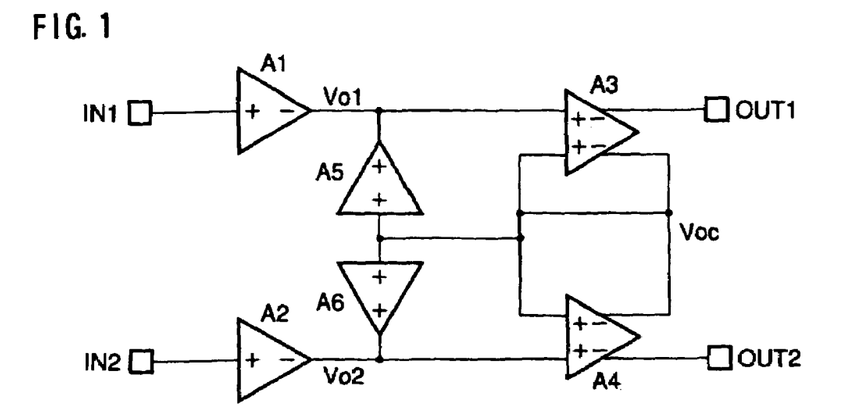
FIG. 1 is a circuit diagram of an operational amplifier circuit according to a first embodiment of the present invention.

FIG. 1 shows an operational amplifier circuit of a balanced structure according to a first embodiment of the present invention.

This balanced operational amplifier circuit provides a first inverted amplifier circuit A1 with a (+) input terminal that receives a first input signal IN1 and a second inverted amplifier circuit A2 with a (+) input terminal that receives a second input signal IN2. This balanced operational amplifier also provides a third inverted amplifier circuit A3 and a fourth inverted amplifier circuit A4. A (−) output terminal of the first inverted amplifier circuit A1 is connected to a first (+) input terminal of the third inverted amplifier circuit A3. A (−) output terminal of the second inverted amplifier circuit A2 is connected to a first (+) input terminal of the fourth inverted amplifier circuit A4. A first (−) output terminal of the third inverted amplifier circuit A3 is connected to a first output terminal OUT1. A first (−) output terminal of the fourth inverted amplifier circuit A4 is connected to a second output terminal OUT2. Second (+) input terminals and second (−) output terminals of the third and fourth inverted amplifier circuits A3 and A4 are connected with each other.

This balanced operational amplifier also provides non-inverted amplifier circuits A5 and A6. The second (+) input terminals and the second (−) output terminals of the third and fourth inverted amplifier circuits A3 and A4 are further connected to (+) input terminals of the non-inverted amplifier circuits A5 and A6. A (+) output terminal of the non-inverted amplifier circuits A5 is connected to the (−) output terminal of the first inverted amplifier circuit A1. A (+) output terminal of the non-inverted amplifier circuit A6 is connected to the (−) output terminals of the second inverted amplifier circuit A2.

In the aforementioned structure, when first and second input signals IN1 and IN2 are inputted to the first and second inverted amplifier circuits A1 and A2, the first and second inverted amplifiers A1 and A2 output signals Vo1 and Vo2, respectively. The output signal Vo1 of the first inverted amplifier circuit A1 is inputted to the first (+) input terminals of the third inverted amplifier circuit A3, and an estimated common-mode output signal Voc is inputted to the second (+) input terminals of the third inverted amplifier circuit A3. Consequently, the third inverted amplifier circuit A3 outputs a first output signal $(-(\alpha Voc+\beta Vo1))$, wherein $\alpha$ and $\beta$ are positive constant numbers, respectively) to the first output terminal OUT1. The third inverted amplifier circuit A3 also outputs a second output signal $(-\gamma(\alpha Voc+\beta Vo1))$, wherein $\alpha$, $\beta$ and $\gamma$ are positive constant numbers, respectively).

Similarly, the output signal Vo2 of the second inverted amplifier circuit A2 and the estimated common-mode output signal Voc are inputted to the first and second (+) input terminals of the fourth inverted amplifier circuit A4, respectively. The fourth inverted amplifier circuit A4 outputs a third output signal $(-(\alpha Voc+\beta Vo2))$ to the second output terminal OUT2 and also outputs a fourth output signal $(-\gamma(\alpha Voc+\beta Vo2))$, wherein $\alpha$, $\beta$ and $\gamma$ are positive constant numbers, respectively).

The estimated common-mode output signal Voc is inputted to the non-inverted amplifier circuits A5 and A6. The non-inverted amplifier circuits A5 and A6 feed their output signals back to the output signals of the first and second inverted amplifier circuits A1 and A2, respectively. The estimated common-mode output signal Voc is generated by adding together the second output signal and the fourth output signal.

In the aforementioned operational amplifier circuit, when the common-mode voltage is fed back to the inverted amplifier circuits A3 and A4 and this common-mode voltage increases, the non-inverted amplifier circuits A5 and A6 try to increase the output voltages Vo1 and Vo2, respectively. To the contrary, the inverted amplifier circuits A3 and A4 try to decrease the output voltages, respectively. As a result, negative feedback is formed. Therefore, different from the conventional circuit, a low-gain amplifier circuit for adding and inverting polarity is no longer required, and only one internal node is required. Therefore, improvement in speed can be realized.

Figure 3:
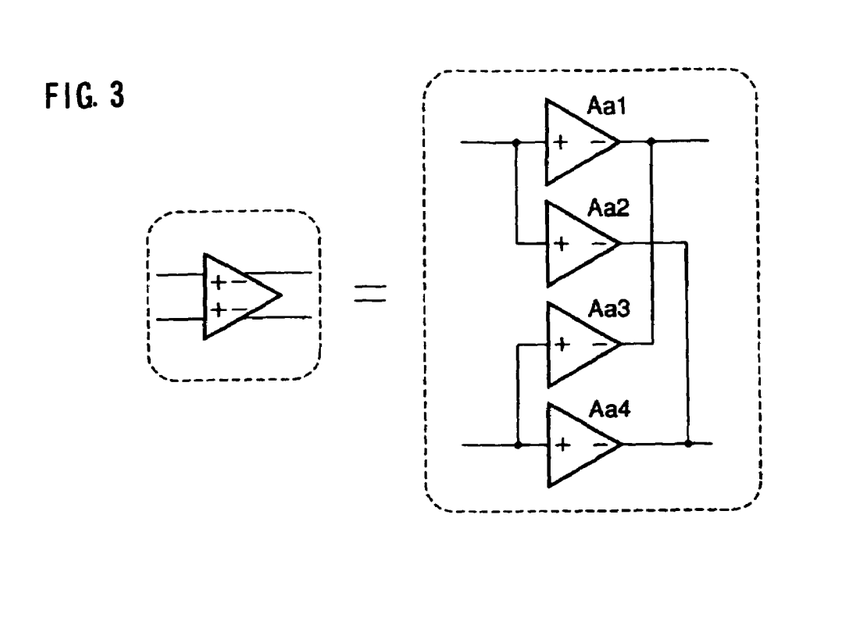
FIG. 3 is a circuit diagram of the inverted amplifier circuit with two inputs and two outputs shown in FIG. 1.

Inverted amplifiers Aa1 to Aa4 as shown in FIG. 3 constitute each of the inverted amplifier circuits A3 and A4 shown in FIG. 1, for example. The (+) input terminals of the inverted amplifiers Aa1 and Aa2 are connected with each other, and input terminals of the inverted amplifiers Aa3 and Aa4 are connected with each other. An output terminal of the inverted amplifier Aa1 is connected to an output terminal of the inverted amplifier Aa3, and an output terminal of the inverted amplifier Aa2 is connected to an output terminal of the inverted amplifier Aa4.

Figure 17:
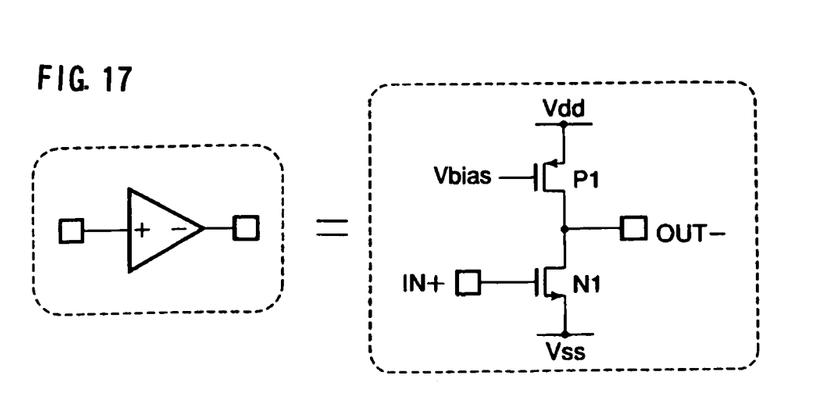
FIG. 17 is a circuit diagram of a transistor circuit of an inverted amplifier.

Each of the inverted amplifiers Aa1 and Aa4 is constituted by the series circuit of PMOS transistor P1 and NMOS transistor N1 as shown in FIG. 17, for example. In detail, a source of the PMOS transistor P1 is connected to a power source Vdd, a gate of the PMOS P1 is connected to a bias source Vbias, and a drain of the PMOS P1 is connected to a drain of the NMOS transistor N1 and an output terminal OUT(−). A source of the NMOS transistor N1 is grounded, and the gate is connected to an input terminal IN(+). This circuit is simple in structure having no nodes other than the input terminal and the output terminal. In other words, the inverted amplifier circuits A3 and A4 have no internal node.

Figure 2:
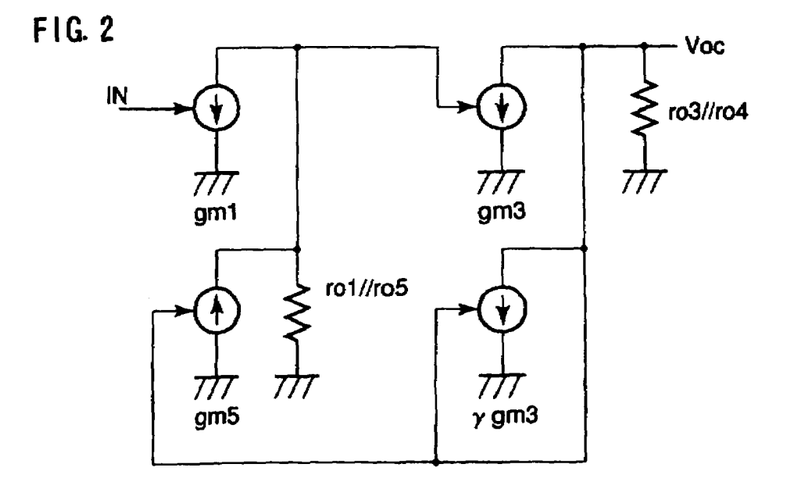
FIG. 2 is an equivalent circuit of the amplifier circuit shown in FIG. 1 for the common-mode signals.

A gain for a differential signal path is represented by a product of the gains of the inverted amplifier circuits A1 (A2) and A3 (A4). In this embodiment, the inverted amplifier circuits A1 and A2 have the same characteristic. Similarly, the inverted amplifier circuits A3 and A4 and the non-inverted amplifier circuits A5 and A6 have the same characteristic, respectively. An equivalent circuit shown in FIG. 2 for the common-mode signal can represent the operational amplifier circuit shown in FIG. 1. In this equivalent circuit, "gm1" denotes a transconductance of the inverted amplifier circuit A1; "gm3" denotes a transconductance of the inverted amplifier circuit A3 from one of the inputs of the inverted amplifier circuit A3 to the Voc output; "γ gm3" is a transconductance of the inverted amplifier circuit A3 from the other of the inputs of the inverted amplifier circuit A3 to the Voc output; "gm5" denotes a transconductance of the non-inverted amplifier circuit A5; "ro1" denotes an output resistance of the inverted amplifier circuit A1; "ro5" denotes an output resistance of the non-inverted amplifier circuit A5; and "ro3" and "ro4" denote output resistances of the inverted amplifier circuits A3 and A4 at the Voc output, respectively.

The transfer function from the input to the output can be obtained by the following formula.

$$Voc/IN=[gm1gm3(ro1//ro5)(ro3//ro4)]/[1+\gamma gm3(ro3//ro4)+gm5gm3(ro1//ro5)(ro3//ro4)]$$

When $\gamma \leq 1$, $gm5(ro1//ro5) \gg 1$, in the embodiment, by the feedback using the non-inverted amplifier circuits A5 and A6, the common-mode signal can be decreased by approximately $1/[gm5(ro1//ro5)]$ as compared with conventional operational amplifier circuits.

Furthermore, as explained above, since the inverted amplifier circuits A3 and A4 per se have no internal nodes, the number of internal nodes of the inverted amplifier circuit shown in FIG. 1 can be one in each circuit path of the differential signals. Therefore, the frequency characteristic can be improved.

Figure 4:
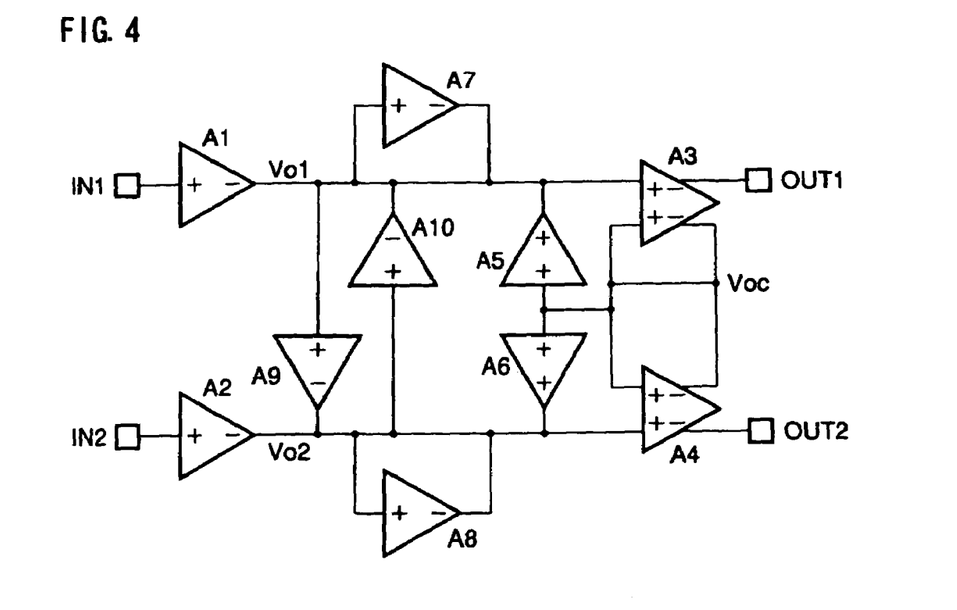
FIG. 4 is a circuit diagram of an operational amplifier circuit according to a modification of the first embodiment.

FIG. 4 shows a modification of the operational amplifier circuit of the first embodiment. According to this modification, inverted amplifier circuits A7 to A10 are added, while the first to sixth amplifier circuits A1 to A6 are connected in the same manner as shown in FIG. 1. That is, the inverted amplifier circuit A7 is connected to the output terminal of the first inverted amplifier circuit A1 and the inverted amplifier circuits A8 is connected to the output terminal of the second inverted amplifier circuits A2. The inverted amplifier circuits A9 and A10 are disposed between the output terminals of the first and second inverted amplifier circuits A1 and A2. The inverted amplifier circuits A9 and A10 are connected with each other in parallel with reverse polarity.

In the other words, a (+) input terminal of the inverted amplifier circuit A9 is connected to the (−) output terminal of the inverted amplifier circuit A1. A (−) output terminal of the inverted amplifier circuit A9 is connected to the (−) output terminal of the inverted amplifier circuit A2. A (+) input terminal of the inverted amplifier circuit A10 is connected to the (−) output terminal of the inverted amplifier circuit A2. A (−) output terminal of the inverted amplifier circuit A10 is connected to the (−) output terminal of the inverted amplifier circuit A1. Input and output terminals of the inverted amplifier circuit A7 are connected to the (−) output terminal of the inverted amplifier circuit A1. Input and output terminals of the inverted amplifier circuit A8 are connected to the (−) output terminal of the inverted amplifier circuit A2.

According to the operational amplifier circuit having the aforementioned circuit structure, with regard to differential input signals IN1 and IN2, a relationship between the output voltages of the inverted amplifier circuits A1 and A2 is represented by Vo1=-Vo2.

Figure 5:
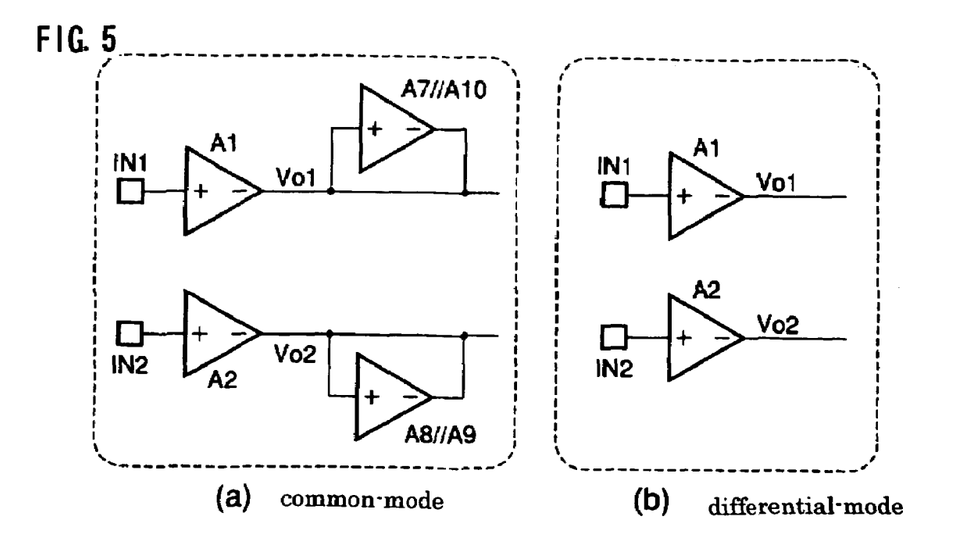
FIG. 5 is an explanatory drawing for explaining the operation of the operational amplifier circuit shown in FIG. 4.

Accordingly, a signal component outputted from the inverted amplifier circuit A9 is cancelled by a signal component outputted from the inverted amplifier circuit A8. Similarly, a signal component outputted from the inverted amplifier circuit A10 is cancelled by a signal component outputted from the inverted amplifier circuit A7. In other words, as shown in FIG. 5(b), the outputs of the inverted amplifier circuits A7 to A10 do not contribute to the differential signals.

On the other hand, when input signals IN1 and IN2 are common-mode signals, a relationship between the output voltages of the inverted amplifier circuits A1 and A2 is represented by Vo1=Vo2.

In this case, a signal component outputted from the inverted amplifier circuit A9 is added to a signal component outputted from the inverted amplifier circuit A8. Similarly, a signal component outputted from the inverted amplifier circuit A10 is added to a signal component outputted from the inverted amplifier circuit A7. As a result, with regard to common-mode signals, the inverted amplifier circuits A7 to A10 are represented by the circuit structure shown in FIG. 5(a).

That is, resistance components at the outputs of the inverted amplifier circuits A1 and A2 become very small, since a value of the resistance component becomes proportional to an inverse of the transconductance from the inverted amplifier circuit A7 to the inverted amplifier circuit A10.

Accordingly, without increasing the number of internal nodes in each circuit path for the differential signals, a common-mode gain of the outputs of the inverted amplifier circuits A1 and A2 can be further decreased, which in turn can decrease a common-mode gain of the entire amplifier circuit.

Second Embodiment

Figure 6:
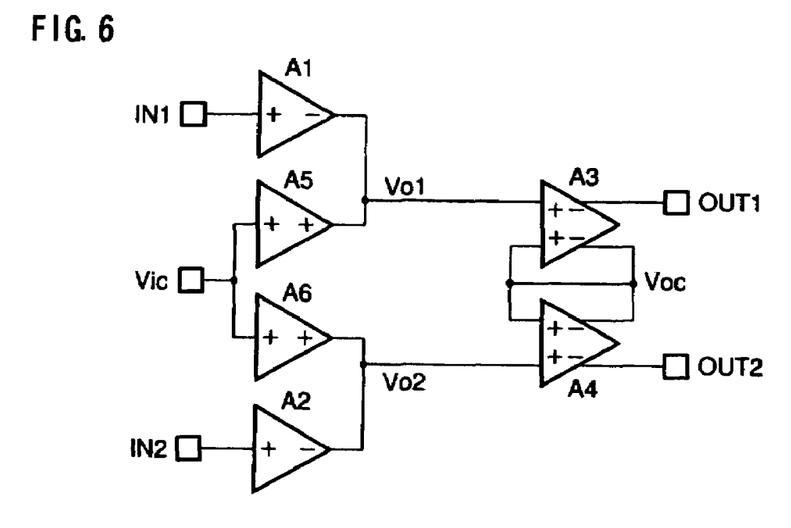
FIG. 6 is a circuit diagram of an operational amplifier circuit according to a second embodiment.

FIG. 6 shows a balanced operational amplifier circuit according to a second embodiment of the present invention. This operational amplifier circuit provides a first inverted amplifier circuit A1 having a (+) input terminal that receives a first input signal IN1 and a second inverted amplifier circuit A2 having a (+) input terminal that receives a second input signal IN2.

This operational amplifier circuit also provides a third inverted amplifier circuit A3 and a fourth inverted amplifier circuit A4. A (−) output terminal of the first inverted amplifier circuit A1 is connected to a first (+) input terminal of the third inverted amplifier circuit A3. A (−) output terminal of the second inverted amplifier circuit A2 is connected to a first (+) input terminal of the fourth inverted amplifier circuit A4. A first (−) output terminal of the third inverted amplifier circuit A3 is connected to a first output terminal OUT1. A first (−) output terminal of the fourth inverted amplifier circuit A4 is connected to a second output terminal OUT2.

Second (+) input terminals of the third and fourth inverted amplifier circuits A3 and A4 are connected with each other, and second (−) output terminals of the third and fourth inverted amplifier circuits A3 and A4 are connected with each other. Therefore, the four terminals, i.e., the second (+) input terminals and the second (−) output terminals, are connected together.

This operational amplifier circuit further provides non-inverted amplifier circuits A5 and A6. To (+) input terminals of the non-inverted amplifier circuits A5 and A6, a common-mode input signal Vic is inputted. A (+) output terminal of the non-inverted amplifier circuits A5 is connected to the (−) output terminal of the first inverted amplifier circuit A1, and a (+) output terminal of the non-inverted amplifier circuits A6 is connected to the (−) output terminal of the second inverted amplifier circuit A2.

In the above structure, when first and second input signals IN1 and IN2 are inputted to the first and second inverted amplifier circuits A1 and A2, respectively, the first and second inverted amplifier circuits A1 and A2 output inverted output signals, respectively. Consequently, a signal proportional to the common-mode input signal Vic, which is an output signal of the non-inverted amplifier circuit A5, is added to the output signal of the inverted amplifier A1 and the sum of the output signals of A1 and A5, Vo1, is inputted to the first (+) input terminal of the third inverted amplifier A3. Then, the third inverted amplifier circuit A3 outputs a first output signal (−(αVoc+βVo1), wherein α and β are positive constant numbers, respectively) to the first output terminal OUT1 and outputs a second output signal (−γ (αVoc+βVo1), wherein α, β and γ are positive constant numbers, respectively).

Similarly, a signal proportional to the common-mode input signal Vic, which is an output signal of the non-inverted amplifier circuit A6, is added to the output signal of the inverted amplifier A2 and the sum of the output signals of A2 and A6, Vo2, is inputted to the first (+) input terminal of the fourth inverted amplifier A4.

Then, the fourth inverted amplifier circuit A4 outputs a third output signal (−(αVoc+βVo2) to the second output terminal OUT2, and outputs a fourth signal (−γ(αVoc+ βVo1), wherein α, β and γ are positive constant numbers, respectively).

In the second embodiment, in the same manner as in the first embodiment, a gain for the differential signal path is represented by the product of a gain of the inverted amplifier circuit A1 (A2) and a gain of the inverted amplifier circuit A3 (A4). In the case of a common-mode signal, an output signal of the inverted amplifier circuit A1 (A2) and an output signal of the non-inverted amplifier circuit A5 (A6) are added to thereby cancel the common-mode signal. Accordingly, a common-mode gain can be decreased without increasing a number of internal nodes.

Figure 7:
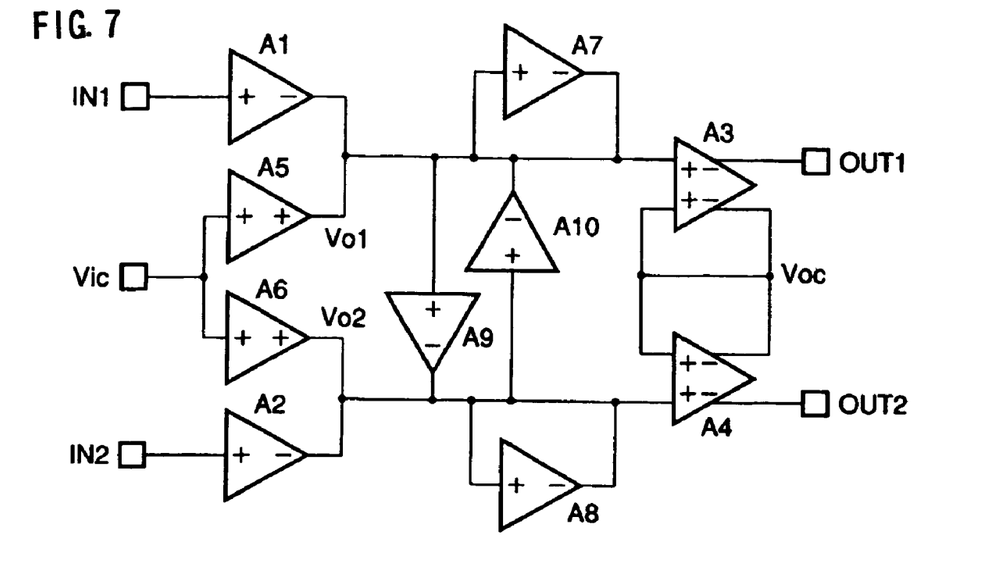
FIG. 7 is a circuit diagram of an operational amplifier circuit according to a modification of the second embodiment.

FIG. 7 shows an operational amplifier circuit in which inverted amplifier circuits A7 to A10 are added to the operational amplifier circuit shown in FIG. 6 for decreasing common-mode gains of the inverted amplifier circuits A1 and A2 as explained with reference to FIG. 4.

According to this modification, although the first to sixth amplifier circuits A1 to A6 are connected in the same manner as shown in FIG. 6, inverted amplifier circuits A7 to A10 are added. That is, the inverted amplifier circuit A7 is connected to the output terminal of the first inverted amplifier circuit A1 and the inverted amplifier circuits A8 is connected to the output terminal of the second inverted amplifier circuits A2. The inverted amplifier circuits A9 and A10 are disposed between the output terminals of the first and second inverted amplifier circuits A1 and A2. The inverted amplifier circuits A9 and A10 are connected with each other in parallel with reverse polarity.

In the other words, a (+) input terminal of the inverted amplifier circuit A9 is connected to the (−) output terminal of the inverted amplifier circuit A1. A (−) output terminal of the inverted amplifier circuit A9 is connected to the (−) output terminal of the inverted amplifier circuit A2. A (+) input terminal of the inverted amplifier circuit A10 is connected to the (−) output terminal of the inverted amplifier circuit A2. A (−) output terminal of the inverted amplifier circuit A10 is connected to the (−) output terminal of the inverted amplifier circuit A1. Input and output terminals of the inverted amplifier circuit A7 are connected to the (−) output terminal of the inverted amplifier circuit A1. Input and ouput terminals of the inverted amplifier circuit A8 are connected to the (−) output terminal of the inverted amplifier circuit A2.

By this structure, in the same manner as in the operational amplifier circuit shown in FIG. 4, the common-mode gain can be further decreased without increasing the number of internal nodes.

Third Embodiment

Figure 8:
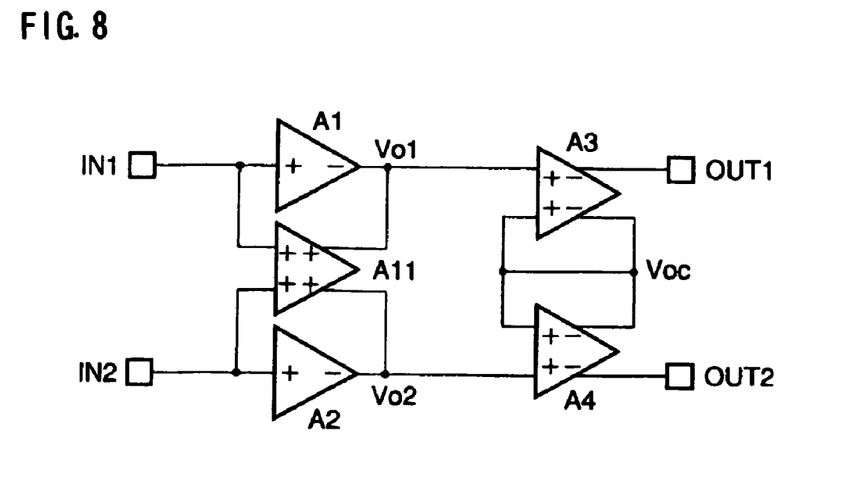
FIG. 8 is a circuit diagram of an operational amplifier circuit according to a third embodiment.

FIG. 8 shows a balanced operational amplifier circuit according to a third embodiment of the present invention.

This operational amplifier circuit provides a first inverted amplifier circuit A1 having a (+) input terminal that receives a first input signal IN1 and a second inverted amplifier circuit A2 having a (+) input terminal that receives a second input signal IN2.

This operational amplifier circuit also provides a third inverted amplifier circuit A3 and a fourth inverted amplifier circuit A4. A (−) output terminal of the first inverted amplifier circuit A1 is connected to a first (+) input terminal of the third inverted amplifier circuit A3. A(−) output terminal of the second inverted amplifier circuit A2 is connected to a first (+) input terminal of the fourth inverted amplifier circuit A4. A first(−) output terminal of the third inverted amplifier circuit A3 is connected to a first output terminal OUT1. A first (−) output terminal of the fourth inverted amplifier circuit A4 is connected to a second output terminal OUT2. Second (+) input terminals and second (−) input terminals of the third and fourth inverted amplifier circuits A3 and A4 are connected with each other.

This operational amplifier circuit further provides a non-inverted amplifier circuit A11. A first (+) input terminal of the non-inverted amplifier circuit A11 is connected to the input terminal of the first inverted amplifier circuits A1. A second (+) input terminal of the non-inverted amplifier circuit A11 is connected to the input terminal of the second inverted amplifier circuits A2. A first (+) output terminal of the non-inverted amplifier circuit A11 is connected to the (−) output terminal of the first inverted amplifier circuits A1. A second (+) output terminal of the non-inverted amplifier circuit A11 is connected to the (−) output terminal of the second inverted amplifier circuits A2.

In the operational amplifier circuit shown in FIG. 8, when first and second input signals IN1 and IN2 are inputted to the first and second inverted amplifier circuits A1 and A2 and the non-inverted amplifier circuit A11, the first and second inverted amplifier circuits A1 and A2 output an inverted output signal, respectively, and the non-inverted amplifier circuit A11 outputs signals proportional to the sum of the first and second input signals (IN1 and IN2). The sum signal (IN1+IN2) is added to the inverted output signal of each of the first and second inverted amplifier circuits A1 and A2. The added signals are Vo1 and Vo2. The added signals Vo1 and Vo2 are inputted to the third and fourth inverted amplifier circuits A3 and A4, respectively.

Thus, the third inverted amplifier circuit A3 outputs a first output signal $(-(\alpha Voc+\beta Vo1))$ to the first output terminal OUT1 and a second output signal $(-\gamma(\alpha Voc+\beta Vo1))$. On the other hand, the fourth inverted amplifier circuit A4 outputs a third output signal $(-(\alpha Voc+\beta Vo2))$ to the second output terminal OUT2 and a fourth output signal $(-\gamma(\alpha Voc+\beta Vo2))$. The estimated common-mode output signal Voc is generated by adding the second output signal and the fourth output signal.

The circuit structure shown in FIG. 8 exemplifies that the non-inverted amplifier circuit A11 generates a common-mode input signal from the first and second input signals IN1 and IN2. This may be used in cases where no common-mode input signal is available in the circuit structure shown in FIG. 6.

Figure 9:
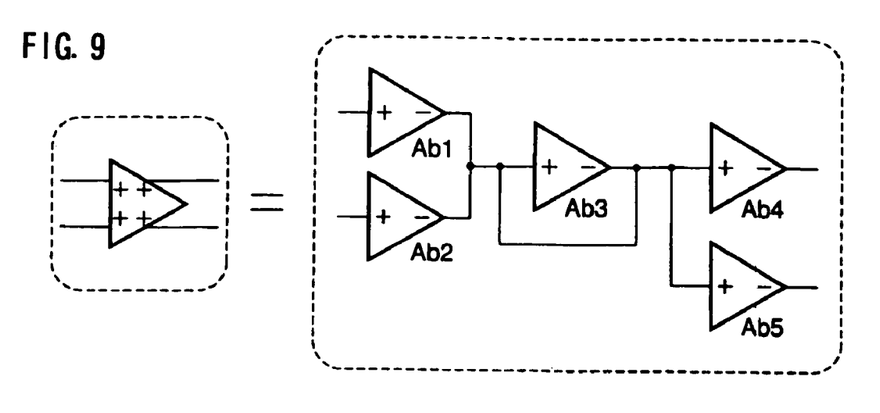
FIG. 9 is a circuit diagram of an inverted amplifier circuit with two inputs and two outputs shown in FIG. 8.

This non-inverted amplifier circuit A11 is constituted by a multi-input/multi-output amplifier circuit and is constituted, for example, by inverted amplifier circuits Ab1 to Ab5 as shown in FIG. 9.

In detail, output terminals of the inverted amplifiers Ab1 and Ab2 are connected with each other and connected to an input terminal of the inverted amplifier Ab3. Input and output terminals of the inverted amplifier Ab3 are connected with each other and connected to input terminals of the inverted amplifiers Ab4 and Ab5.

According to this circuit structure, common-mode signals from the inverted amplifiers Ab1 and Ab2 are added and then inputted to the inverted amplifiers Ab4 and Ab5 via the inverted amplifier Ab3. The inverted amplifier Ab4 and Ab5 output signals proportional to the sum of the input signals IN1 and IN2.

Figure 10:
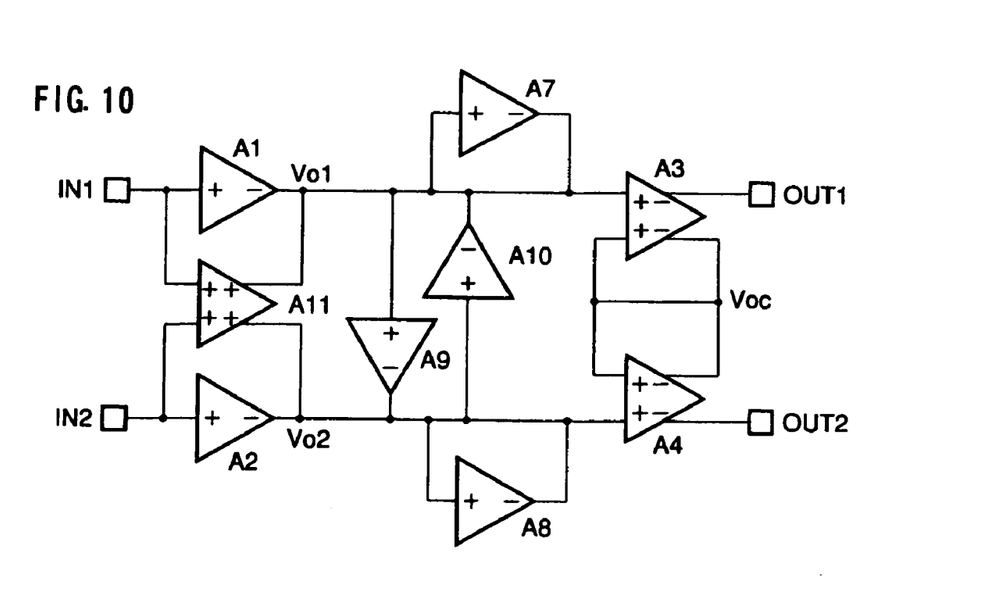
FIG. 10 is a circuit diagram of an operational amplifier circuit according to a modification of the third embodiment.

FIG. 10 shows an embodiment in which inverted amplifier circuits A7 to A10 are added to the operational amplifier circuit shown in FIG. 8 to further decrease the common-mode gain as explained with reference to FIG. 4.

According to this modification, although the first to sixth amplifier circuits A1 to A6 are connected in the same manner as shown in FIG. 8, inverted amplifier circuits A7 to A10 are added. That is, the inverted amplifier circuit A7 is connected to the output terminal of the first inverted amplifier circuit A1 and the inverted amplifier circuits A8 is connected to the output terminal of the second inverted amplifier circuits A2. The inverted amplifier circuits A9 and A10 are disposed between the output terminals of the first and second inverted amplifier circuits A1 and A2. The inverted amplifier circuits A9 and A10 are connected with each other in parallel with reverse polarity.

By this structure, in the same manner as in the operational amplifier circuit shown in FIG. 4, the common-mode gain can be further decreased without increasing the number of internal nodes.

Figure 11:
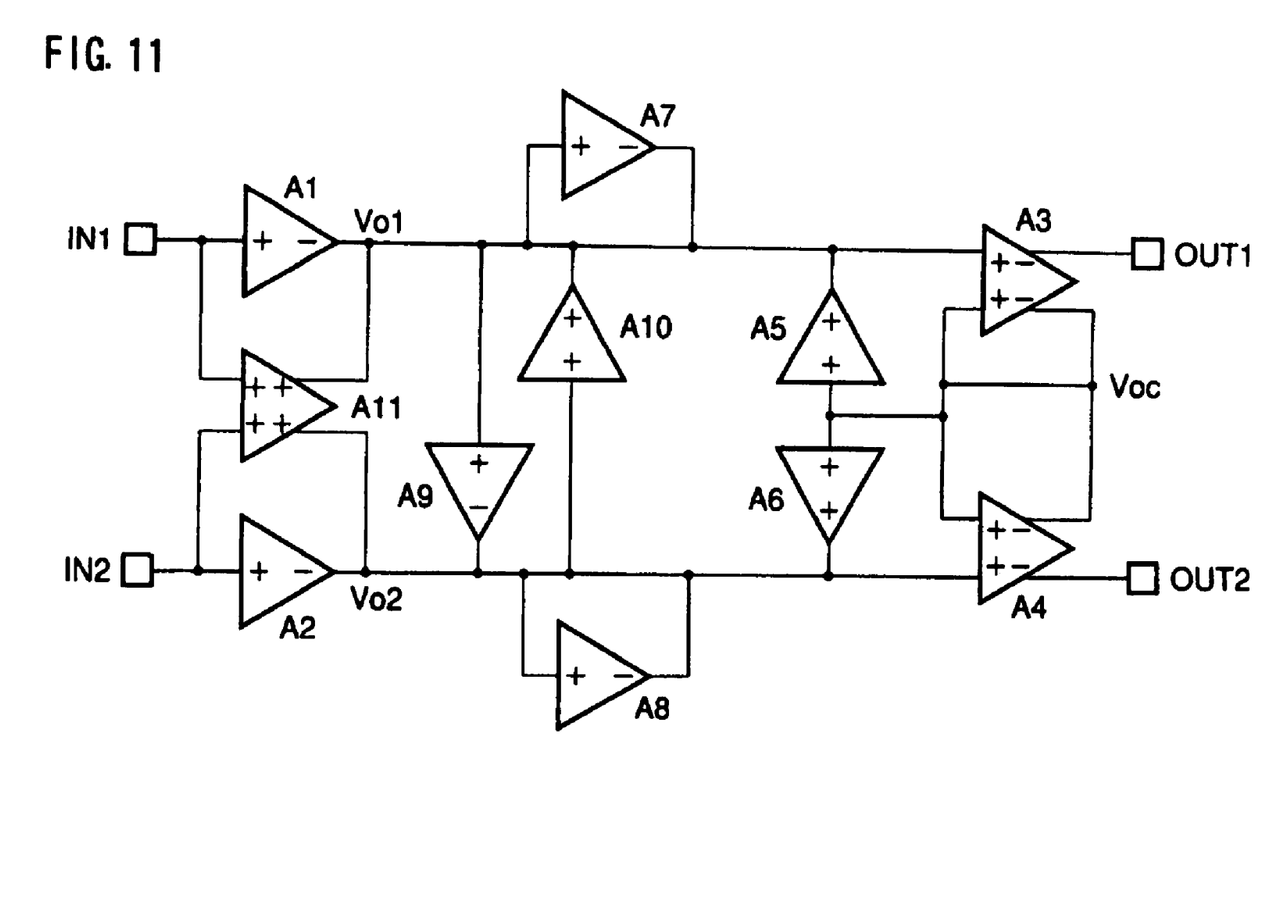
FIG. 11 is a circuit diagram of an operational amplifier circuit in which both the first embodiment and the third embodiment are employed.

FIG. 11 shows an operational amplifier circuit to which both the first embodiment and the third embodiment are applied. In detail, the amplifier circuits A1 to A10 correspond to the amplifier circuits A1 to A10 of the first embodiment shown in FIG. 4. The amplifier circuit A11 in FIG. 11 corresponds to the amplifier circuit A11 of the third embodiment shown in FIG. 8. With this structure, the common-mode gain also can be further decreased without increasing the number of internal nodes in each circuit path of the differential signals.

Figure 12:
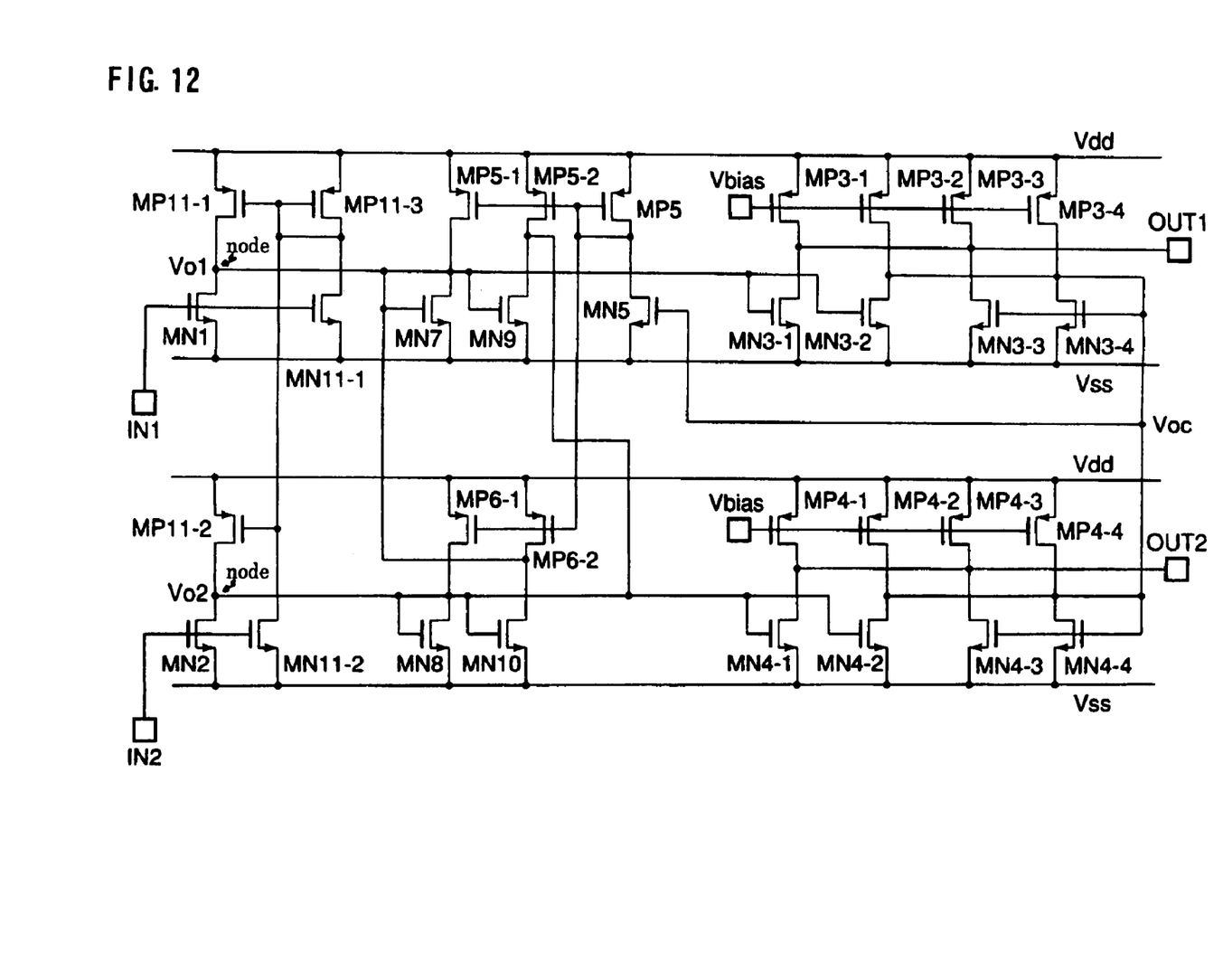
FIG. 12 is a concrete circuit diagram of an operational amplifier circuit shown in FIG. 11.

FIG. 12 shows a circuit diagram in which the operational amplifier circuit shown in FIG. 11 is constituted by MOS transistors. The transistor MN1 corresponds to the inverted amplifier circuit A1, and the transistor MN2 corresponds to the inverted amplifier circuit A2. The transistors MN11-1, MN11-2, MP11-1 to MP11-3 constitute the non-inverted amplifier circuit A11. The transistors NM7 to MN10 correspond to the inverted amplifier circuits A7 to A10, respectively.

The transistors MN5, MP5, MP5-1 and MP5-2 constitute the non-inverted amplifier circuit A5, and the transistors MN5, MP5, MP6-1 and MP6-2 constitute the non-inverted amplifier circuit A6. The input portion of the non-inverted amplifier circuits A5 and A6 shares the transistors MN5 and MP5.

The transistors MN3-1 to MN3-4 and MP3-1 to MP3-4 constitute the inverted amplifier circuit A3 and the transistors MN4-1 to MN4-4 and MP4-1 to MP4-4 constitute the inverted amplifier circuit A4.

As will be understood from the transistor circuit shown in FIG. 12, this operational amplifier circuit can be realized by a structure having no stacked-transistor connection, resulting in a low power-supply voltage operation.

Furthermore, as explained above, in the path from the input IN1 to the output OUT1, also in the path from the input IN2 to the output OUT2, it is possible to limit the number of internal nodes to one. That enables an improvement in the frequency characteristic for a differential signal.

Figure 13:
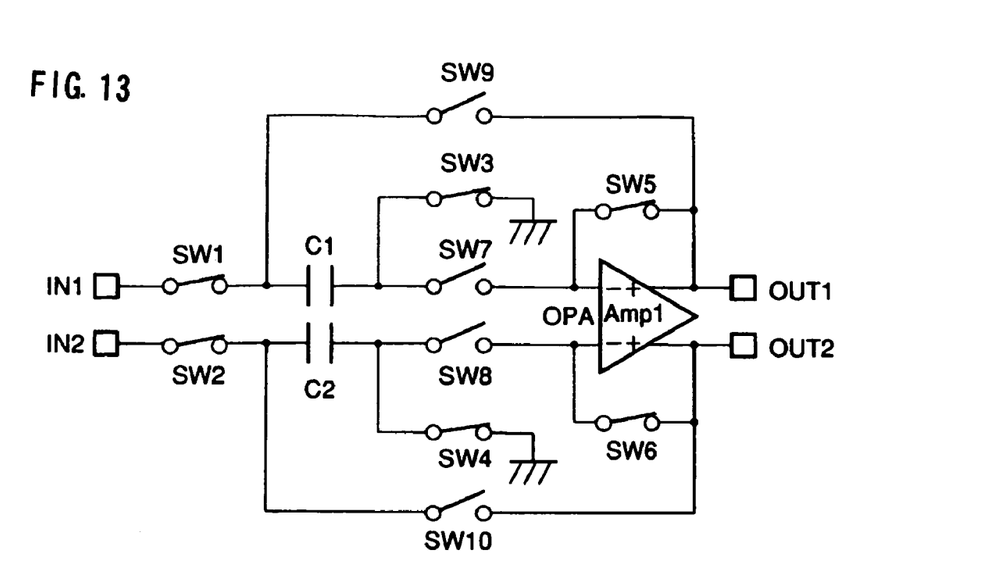
FIG. 13 is a circuit diagram showing a sampling state of a sample/hold circuit using an operational amplifier circuit of the present invention.
Figure 14:
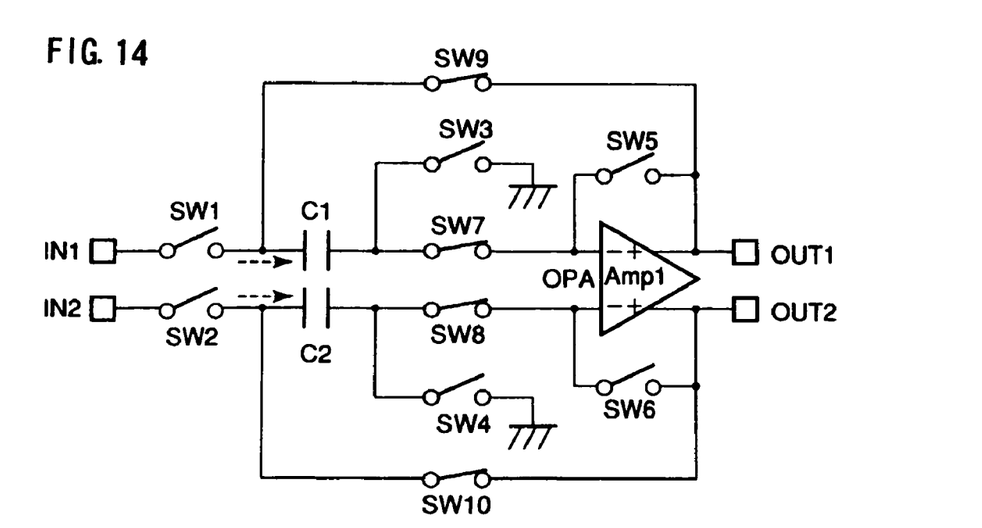
FIG. 14 is a circuit diagram showing a holding state of a sample/hold circuit using an operational amplifier circuit of the present invention.

FIGS. 13 and 14 show a sample/hold circuit using an operational amplifier circuit Amp1 according to the present invention. In this sample/hold circuit, at the time of sampling, as shown in FIG. 13, the switches SW1 to SW6 are closed and the switches SW7 to SW10 are opened. An input signal IN1 is provided to a capacitor C1, which is grounded via SW3. A first input terminal and a first output terminal of Amp1 are connected via SW5. In the same manner, an input signal IN2 is provided to a capacitor C2, which is grounded via SW4. A second input terminal and a second output terminal of Amp1 are connected via SW6.

In this state, when the input signals IN1 and IN2 are inputted, the input signals are stored in the capacitors C1 and C2. In other words, the input signals are memorized (sampled).

At the time of reading, as shown in FIG. 14, the switches SW1 to SW6 are opened and the switches SW7 to SW10 are closed. The first input terminal and the first output terminal of Amp1 are connected through SW7, C1 and SW9. The second input terminal and the second output terminal of Anip1 are connected through SW8, C2 and SW10. At this time, the signals stored in the capacitors C1 and C2 are outputted to the operational amplifier circuits OPA.

In the sample/ hold circuit as mentioned above, MOS transistors constitute the switches in general. In an MOS transistors, at the time of turning on and off, channel charge is absorbed and released in common-mode. Assuming that the switches are composed of NMOS transistors, when the switches SW1 and Sw2 are turned off, the voltages at the input terminals of the Amp1 increase in common-mode due to this channel charge injection to the capacitors C1 and C2. If this voltage increase is not prevented, an amplification operation is saturated. In the present invention, since common-mode components are canceled in the operational amplifier circuit OPA, the common-mode gain decreases, resulting in no saturation. A low power-supply voltage operation of a sample/hold circuit can be achieved.

Figure 15:
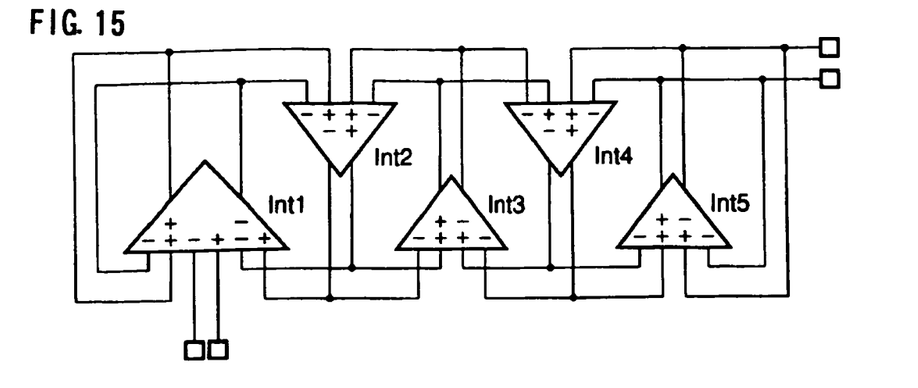
FIG. 15 is a circuit diagram showing a filter using integrators.
Figure 16:
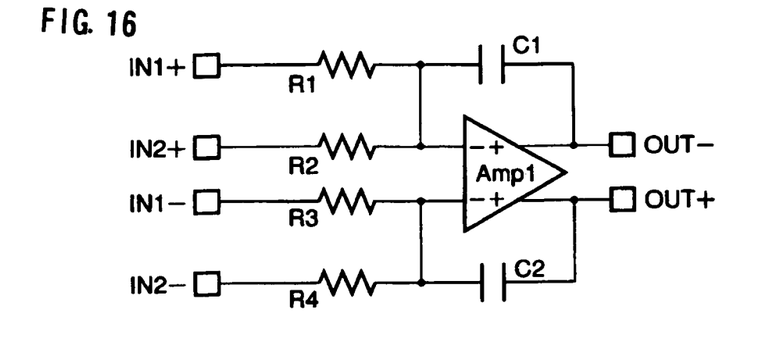
FIG. 16 is a concrete circuit diagram of an integrator.

FIG. 15 shows a filter using an operational amplifier circuit according to the present invention. A filter is constituted by integrators. An integrator is composed of an amplifier Amp1, resistors R1 to R4 and capacitors C1 and C2.

According to the present invention, an operational amplifier circuit of the present invention is used as the amplifier Amp1.

The filter is constituted, for example, by integrators Int1 to Int5. A first stage integrator Int1 uses the operational amplifier circuit for generating a common-mode signal as shown in FIGS. 1 and 8. Operational amplifier circuits used in integrators Int2 to Int5 at the subsequent stages can utilize the common-mode components Voc contained in the output signal of the operational amplifier circuit at the preceding stages, and therefore employ operational amplifier circuits shown in FIGS. 6 and 7.

As explained above, according to an operational amplifier circuit of the present invention, in an operational amplifier circuit of a balanced structure having two gain stages which is appropriate for a lower power-supply voltage, the frequency characteristic can be improved by suppressing the common-mode signal sufficiently and limiting the number of internal nodes in each differential signal path to one.

Additional advantages and modifications will readily occur to those skilled in the art. Therefore, the invention in its broader aspects is not limited to the specific details, representative embodiments shown and described herein. Accordingly, various modifications may be made without departing from the spirit or scope of the general inventive concept as defined by the appended claims and their equivalents.

What is claimed is:

1. An operational amplifier circuit, comprising:
   a first inverted amplifier circuit that receives a first input signal;
   a second inverted amplifier circuit that receives a second input signal;
   a first non-inverted amplifier circuit that receives a common-mode input signal,
   a second non-inverted amplifier circuit that receives the common-mode input signal,
   a third inverted amplifier circuit that receives an estimated common-mode output signal and a sum of the output signal of the first non-inverted amplifier and the output signal of the first inverted amplifier circuit, and outputs a first output signal and a second output signal; and
   a fourth inverted amplifier circuit that receives the estimated common-mode output signal and a sum of the output signal of the second non-inverted amplifier and the output signal of the second inverted amplifier circuit, and outputs a third output signal and a fourth output signal,
   wherein adding the second output signal and the fourth output signal creates the estimated common-mode output signal.

2. The operational amplifier circuit according to claim 1, wherein the first and second input signals are differential input signals.

3. The operational amplifier circuit according to claim 1, further comprising:
   a fifth inverted amplifier circuit that receives the output signal of the first inverted amplifier circuit and outputs an output signal fed back to the output of the first inverted amplifier circuit;
   a sixth inverted amplifier that receives the output signal of the second inverted amplifier circuit and outputs an output signal fed back to the output of the second inverted amplifier circuit;
   a seventh inverted amplifier circuit that receives the output signal of the first inverted amplifier circuit and outputs an output signal fed back to the output of the second inverted amplifier circuit; and
   an eighth inverted amplifier that receives the output signal of the second inverted amplifier circuit and outputs an output signal fed back to the output of the first inverted amplifier circuit.

* * * * *